US010524382B2

United States Patent
Khachaturov

(10) Patent No.: US 10,524,382 B2
(45) Date of Patent: Dec. 31, 2019

(54) SYSTEM AND METHOD FOR FORCED AIR COOLING OF ELECTRICAL DEVICE

(71) Applicant: Dmytro Khachaturov, Kharkov (UA)

(72) Inventor: Dmytro Khachaturov, Kharkov (UA)

( * ) Notice: Subject to any disclaimer, the term of this patent is extended or adjusted under 35 U.S.C. 154(b) by 0 days.

(21) Appl. No.: 16/051,977

(22) Filed: Aug. 1, 2018

(65) Prior Publication Data
US 2019/0069441 A1  Feb. 28, 2019

(30) Foreign Application Priority Data

Aug. 28, 2017  (UA) ................................ A201708708
Sep. 20, 2017  (UA) ................................ A201709245
Sep. 21, 2017  (UA) ................................ A201709265

(51) Int. Cl.
*H05K 7/20*  (2006.01)

(52) U.S. Cl.
CPC ..... *H05K 7/20145* (2013.01); *H05K 7/20154* (2013.01)

(58) Field of Classification Search
CPC .......... H05K 7/20745; H05K 7/20836; H05K 7/20736; H05K 7/20754; H05K 7/20827; H05K 5/0213; H05K 7/20145; H05K 7/2079; H05K 7/20327; H05K 7/20; H05K 5/0217; G06F 1/20; G06F 19/3481
See application file for complete search history.

(56) References Cited

U.S. PATENT DOCUMENTS

| | | | | |
|---|---|---|---|---|
| 9,807,911 | B1* | 10/2017 | Bryan | G06F 1/20 |
| 2006/0120043 | A1* | 6/2006 | Wolford | H05K 1/0272 361/695 |
| 2007/0076370 | A1* | 4/2007 | Mongia | G06F 1/203 361/690 |
| 2007/0223200 | A1* | 9/2007 | Fujiya | H05K 7/20727 361/727 |
| 2012/0069514 | A1* | 3/2012 | Ross | H05K 7/20727 361/679.33 |
| 2012/0243172 | A1* | 9/2012 | Ross | G06F 1/187 361/679.37 |
| 2014/0060086 | A1* | 3/2014 | Ranalli | B60H 1/00478 62/3.3 |

* cited by examiner

*Primary Examiner* — Adam B Dravininkas
(74) *Attorney, Agent, or Firm* — Nadya Reingand; Yan Hankin

(57) ABSTRACT

An invention relates to a field of electrical engineering, in particular to various cabinet-type electronic devices of a general purpose with an equipment airflow cooling, conducted by virtue of a forced ventilation, and can be used in construction of various electrical devices, particularly of electric motor control stations. A claimed invention essence lies in a fact that the forced air cooling system of the power and low-current components of the electrical device contains an air heat exchanger, the power electronic components, as well as coolers, being in a thermal contact with the low-current electronic components, configured to be cooled with the single flow of previously cleaned extraneous air directed from a top of the enclosure to its bottom part. The coolers are spaced along a length of an air channel of the electronic device, forming a mixing zone of heated and cool air.

7 Claims, 3 Drawing Sheets

SYSTEM AND METHOD FOR FORCED AIR COOLING OF ELECTRICAL DEVICE

CROSS-REFERENCES TO RELATED APPLICATIONS

The present patent application claims priority to Ukrainian patent application a201708708 filed Aug. 28, 2017, Ukrainian patent application a201709245 filed Sep. 20, 2017, Ukrainian patent application a201709265 filed Sep. 21, 2017, Russian patent application 2017142042 filed Dec. 1, 2017, Russian patent application 2017142040 filed Dec. 1, 2017, Russian patent application 2017142056 filed Dec. 1, 2017.

FIELD OF INVENTION

An invention relates to a field of electrical engineering, in particular to various cabinet-type electronic devices of a general purpose with an airflow cooling of an equipment, conducted by virtue of a forced ventilation, and can be used in construction of various electrical devices, particularly of electric motor control stations.

BACKGROUND

Cooling methods and systems, utilized, for example, in distribution cabinets with electrical equipment, emitting a significant dissipated heat energy, providing a generated heat dissipation by virtue of both natural and forced ventilations, are currently in use.

The natural ventilation involves a presence of a large number of ventilation openings and a direct contact with an outside ambient, which does not allow to use such an equipment in areas with high humidity of environment.

The forced ventilation allows to mechanize the cooling of the electrical equipment in sealed cabinets, simultaneously providing a necessary moisture protection. The most common ventilation methods in use include air cooling systems, enclosing heat exchangers, containing a cooling liquid or other refrigerant agents. Such cooling methods require an arrangement of fluid supply and discharge systems, as well as an installation of additional tanks, which leads to complexity of a design, increases its dimensions and affects a prime cost of such equipment.

A known cooling system embodiment constitutes a forced air ventilation excluding using of additional cooling agents.

Mechanical Patent RU2239267 dated 27 Oct. 2004 Int. Cl. H05K 7/20 "Cabinet for Electrical Motor Control Station" sets out a heat removal system, according to which an electronic device comprises an air channel of a rectangular section, having one side wall, coincidently constituting a back wall of an enclosure, while its opposite wall contains a radiator (cooler) surface, comprising gills and electrical equipment mounting spots arranged therein. The air channel is performed between the side walls of the enclosure. An opening, executed on the enclosure back wall in opposite to the radiator surface center, contains an integrated ventilation unit cell. A cell input and air channel outlets, designed as windows on the side walls of the cabinet, are covered with a protective grid.

Disadvantages of this technical solution may include a joint ventilation of all compartments of the device, which can lead to an inefficient use of a cooling devices resource due to a fact that the equipment of a different power and with different degrees of heating is installed inside of the cabinet. In this way, it requires a significant energy consumption to provide a sufficiently cooled air, that is not necessary for all installed equipment.

Also Patent for Utility Model RU158897 of Russian Federation Int. Cl. H05K 7/20 "Composition of Cooling System of Frequency Transformer Inverter Cabinet" sets out a forced air cooling system of a cabinet, containing power and low-current electronic devices, and including guide air channels and at least one blowing fan, and involving at least two independent cooling circuits, available as following: the first circuit is being used for cooling a power part and the second circuit is used for cooling low-current electronic devices. The cabinet with power and low-current electronic devices is divided into isolated sections for an air flows separation, while the power electrical equipment is divided into separate power units, installed onto a wall, separating cells. The first circuit contains the guide air channels, configured to form a pressurized air supply directly to radiators of the power electronic devices of power units, while the blowing fans of the cooling circuits are installed separately and have a different power. The supply of the cooling air in the first cooling circuit is conducted separately for each vertical row of the units along the common guide air channel, equipped with outlet openings, located against each cooler (radiator) of the power unit.

Disadvantages of the technical solution, described in the patent, may include an air supply, executed from a bottom part of the cabinet, which requires an installation of air filters for each of the blowing fans. Also the arrangement of the air channel within the first circuit with outputs for each cooled device can reduce an efficiency of the cooling system due to separating the supplied air flow.

Mechanical Patent No. U.S. Pat. No. 9,545,037 (B2) dated 10 Jan. 2017 Int. Cl. H05K7/20 "System and Method for Electric Drives Cooling" sets out a method of a forced air cooling of an electronic device, according to which an enclosure is made with at least one sealed compartment, protected from an outside ambient contact. This enclosure comprises both power and low-current electronic components, as well as at least one heat exchanger, connected to the sealed compartment. Upper and lower compartments are executed sealed. The upper and lower compartments contain sets of electrical elements. An air channel adjacent to the upper and lower sealed compartments forms a common wall with the aforementioned compartments. In accordance with the described method, the cooling system includes an upper heat exchanger, arranged in the air channel and mounted onto the common wall, providing a possibility of air passing from the upper sealed compartment, as well as a lower heat exchanger unit, arranged in the air channel and mounted onto the common wall, providing a possibility of air passing from the lower sealed compartment. Each of the heat exchangers constitutes an air-to-air cross-type heat exchanger, having a plurality of passageways, formed between rows of plates, central portions of which are substantially planar and parallel.

Disadvantages of the described technical solution may include an arrangement of the power electrical equipment, such as reactors, in a separate sealed compartment, which requires an installation of additional recirculating fans, which adds a complexity to the device design. Also the disadvantages may include installing a main blowing fan outside of the station, which can lead to its rapid wear due to an impact of sand and dust, as well as a separation of the flow into two parts, which requires an increase of the blowing fan power.

The claimed technical solution aims solving a technical problem, constituting a creation of a forced air cooling system of a simplified design and providing effective cooling of both power and low-current electronic components by means of a single directed air flow, as well as a method of an embodiment of the said forced air cooling system.

SUMMARY

A technical result, achieved from implementation of the claimed method, consists in simplifying the design, reducing dimensions of the electronic device and increasing efficiency of the cooling system of both power and low-current electronic components, as well as in increasing efficiency of an air dehumidification of a sealed enclosure of the electric device, providing a moisture removal without a loss of sealing.

A claimed invention essence lies in a fact that the forced air cooling system of the power and low-current components of the electrical device contains an air heat exchanger, the power electronic components, as well as coolers, being in a thermal contact with the low-current electronic components, configured to be cooled with the single flow of previously cleaned extraneous air directed from a top of the enclosure to its bottom part. The coolers are spaced along a length of an air channel of the electronic device, forming a mixing zone of heated and cool air. Also, a bypass air channel is arranged above at least one cooler, providing the cool air supply to the mixing zone.

According to a preferred embodiment of the invention the bypass air channel is arranged within the air channel of the electrical device and is configured to control an air flow motion by partial closing of an inlet opening with a regulating gate.

Also according to the claimed invention the mixing zone of the air flows is arranged within a space located between the coolers with a partial use of their internal volume.

Also the power electronic components are represented as at least one inductance coil in the claimed forced air cooling system of the electrical device. Also the mentioned coil contains a solenoid, cooled by the directed air flow, concentrated in the air channels, formed between polymer casings and coils of the solenoid by means of eliminating any motion of the said air flow via a core of the coil.

The low-current electronic components are advantageously located in the sealed compartment and include at least one thermoelectric device capable of the moisture removal from the sealed compartment of the electrical device within the described system. The said device contains cooled and heated surfaces. The heated surface is configured in thermal contact with the cooler placed inside of the air channel in the way of the directed air flow.

According to the method, implemented on the basis of the described cooling system, the air exchanger, as well as the power electronic components and coolers, being in a thermal contact with the low-current electronic components, are cooled with the single flow of previously cleaned extraneous air, directed from the top of the enclosure to its bottom part, while directing the air flow through the coolers, spaced along the length of the air channel of the electronic device, into the mixing zone of heated and cool air. Wherein the cool air is supplied into the mixing zone by means of the bypass air channel, installed above at least one cooler.

Also according to the claimed method a sealed cooling circuit is capable of the moisture removal and is formed of at least one sealed compartment with the low-current electronic components placed therein predominantly, as well as of at least one air heat exchanger and an air channels systemio

BRIEF DESCRIPTION OF THE DRAWINGS

An essence of the claimed invention is explained, but is not limited to the following drawings:

DETAILED DESCRIPTION OF THE PREFERRED EMBODIMENT

The claimed invention can be embodied as the system or device and the method of the forced air cooling of the cabinet-type electrical device, comprising enclosure 1 (FIG. 1), containing the power and low-current electronic components, installed both directly inside of the enclosure and on the surface of coolers (radiators) 2, 3, placed in a way of the directed air flow, mostly within air channel 4, equipped with blowing fan 5.

Figure 2:
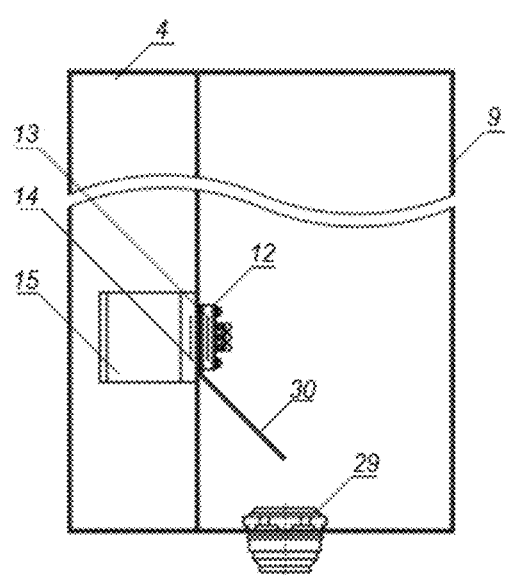
FIG. 2 shows the thermoelectric device of moisture removal.

According to the described embodiment, the forced air cooling system involves a presence of at least two independent cooling circuits 6, 7. While at least first of said cooling circuits 6 is configured sealed from adjacent second cooling circuit 7 and protected from the outside ambient contact. Sealed cooling circuit 6 contains predominantly low-current electronic components 8, enclosed within sealed compartment 9, as well as at least one an air heat exchanger 10, connected to the said sealed compartment by means of first air channels system 11. Also cooling circuit 6 is capable to remove the moisture, that can condensate out of air while sharp variations in temperature occur by means of thermoelectric device 12 (FIG. 2), containing cooling 13 and heated 14 surfaces, while the heated surface is configured in the thermal contact with cooler 15, placed inside of the second air channel 4 in a way of the directed air flow.

Figure 3:
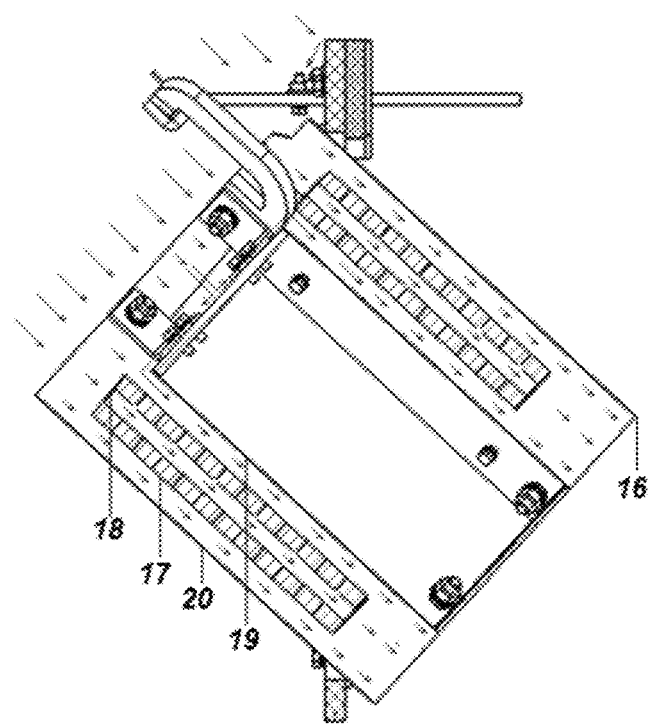
FIG. 3 shows the inductance coil.

Also air heat exchanger 10 and the power electronic components are arranged in the way of the flow of previously cleaned extraneous air, directed from the top of the enclosure to its bottom part. According to the described embodiment the power electronic components are represented as at least one inductance coil 16. Said inductance coil, that is shown on FIG. 3 in details, comprising solenoid 17, which is cooled by the directed air flow, said air flow being concentrated in air channels 18, formed between polymer casings 19, 20 and coils of the solenoid by means of eliminating any motion of the said air flow via the core of the coil.

Figure 1:
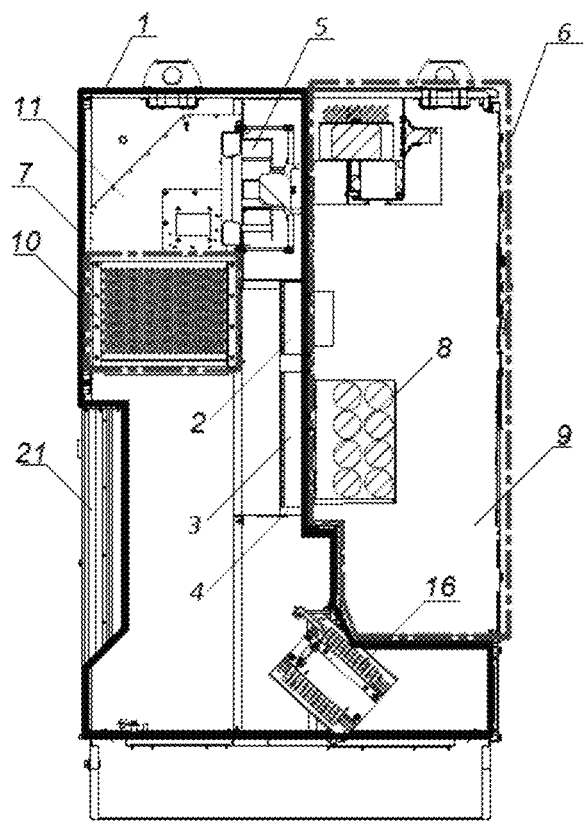
FIG. 1 shows a layout of the electronic device compartments.

Air heat exchanger 10, placed in the way of the directed air flow, predominantly is made of a set of hollow tube elements, that also provide advanced air purification from mechanical impurities. Providing that according to the claimed embodiment of the invention the air cooling system is equipped with sand and dust protection device 21 (FIG. 1).

According to the claimed embodiment air channel 4 of the electrical device constitutes a part of cooling circuit 7. Said air channel is executed as a vertical ventilation duct, separating the compartments of the electrical device, containing a chamber with coolers 2, 3, as well as cooler 15 of thermoelectrical device 12 for moisture removal.

Figure 4:
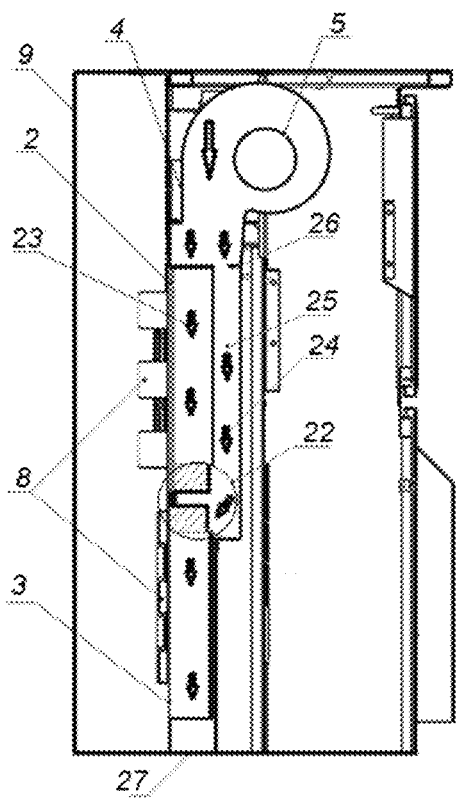
FIG. 4 shows the air channel of the forced air cooling system.

Air channel 4 is shown on FIG. 4 in details. According to the described embodiment of the invention coolers 2, 3 are spaced along the length of air channel 4 of the electronic device, forming mixing zone 22 of heated 23 and cool 24 air flows, providing that bypass air channel 25 of the cool air supply to mixing zone 22 is arranged above at least one cooler 2. Bypass air channel 25 is arranged within air channel 4 of the electrical device and is configured to control the air flow motion by partial closing of the inlet opening with regulating gate 26. Also according to the preferred embodiment air flows mixing zone 22 is arranged within the space located between the coolers with the partial use of their internal volume. Such design allows to increase an efficiency of the cooling system and reduce the dimensions of the air channel.

The method or device based on exploiting the abovementioned system of the forced air cooling of the electrical device comprises providing a first cooling circuit sealed 6 from an adjacent circuit 7 and protected from contact with the outside ambient; conducting the cooling air circulation in sealed circuit 6 in the closed cycle within at least one sealed compartment 9 of sealed circuit 6; cooling the air in sealed circuit 6 by means of an air heat exchanger 10, the air heat exchanger being connected to the sealed compartment 9 and installed in adjacent cooling circuit 7; performing the thermal contact of coolers with low-current electronic components; cooling heat exchanger 10 the power electronic components and the coolers with the single flow of previously cleaned extraneous air directed from the top of the enclosure to its bottom part; arranging coolers 3 along the length of air channel 4 of the electronic device, while forming zone 22 of mixing heated 23 and cool 24 air flows; supplying the cool air into the mixing zone by means of bypass air channel 25, installed above at least one cooler 2; configuring sealed cooling circuit 6 to perform the moisture removal; forming sealed cooling circuit 6 of at least one sealed compartment 9 with low-current electronic components 8 placed therein predominantly, as well as of at least one air heat exchanger 10 and air channels system 11.

The claimed system of the forced air cooling operates as follows.

Figure 5:
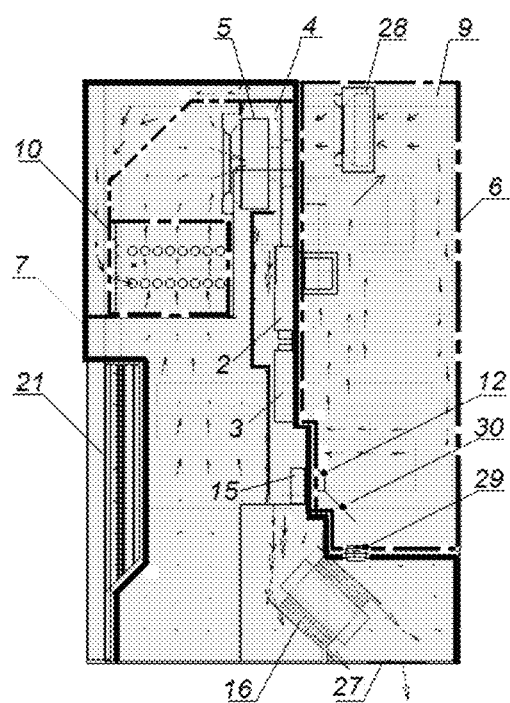
FIG. 5 shows a chart of the air flows motion.

The chart of the air flow motion is shown on FIG. 5. Air from the outside ambient is being drawn into unsealed cooling circuit 7 (marked with a heavy line) under an influence of blowing fan 5 through sand and dust protection device 21. The insertion air passes around the hollow tube elements of air heat exchanger 10, while obtaining the advanced purification, and afterwards gets into air channel 4, providing a passage of the cooling air through coolers 2, 3, 15, as well as cooled power electronic components 16.

The cooling air is supplied into air channel 4 under the influence of blowing fan 5 (as shown on FIG. 4), where it comes on the first cooler 2, providing that a part of the cool air gets into bypass air channel 25, through which it passes to enter mixing zone 22 of cool 24 and heated 23 air. After passing air flows mixing zone 22 the cooled air gets into cooler 3, following in the way of the air flow motion, and in being drawn out through openings 27, located in the bottom part of the enclosure of the electronic device.

Simultaneously the cooling of the electronic components, arranged within sealed compartment 9, is conducted by means of a continuous circulation of the cooling air within the closed cooling circuit by virtue of at least one recirculating fan 28. The cooling air flow is supplied onto units with the electrical equipment, after passing of which the heated air gets into air heat exchanger 10, that is being cooled by means of insertion extraneous air 5. The cooled air is used repeatedly for cooling the electronic components of at least one sealed compartment after passing the heat exchanger.

Providing that the moisture removal is performed in course of the continuous air circulation within cooling circuit 6 by means of thermoelectric device 12. The condensed moisture is removed out of the enclosure of the electrical device without the sealing loss, using at least one partly permeable drainage element 29, by means of which the moisture is drawn outside and its ingress into the enclosure of the electrical device is prevented. The moisture condensed on the surface of the thermoelectrical device is directed into an inlet of drainage element 29, providing that at least one drainage element is installed in the bottom part of the enclosure and aligned vertically with moisture removal element 30, placed above the drainage element and connected with the thermoelectrical device.

The implementation of the claimed invention is instrumental for the mentioned technical result, providing simplifying the design of the cooling system, reducing dimensions of the electrical device and increasing efficiency of the cooling system of both power and low-current electronic components by means of a single directed air flow. Also the implementation of the described system and method of the forced air cooling leads to increase in efficiency of the air dehumidification of the sealed enclosure of the electric device, providing the moisture removal without the sealing loss.

The claimed invention provides various options and alternative forms of embodiment. A particular embodiment is disclosed in a description and illustrated by means of the given graphic materials. The described system and method are not limited by the particular disclosed form and may encompass all possible embodiments, equivalents and alternatives, within the limits of essential features disclosed in the claim.

What is claimed is:

1. A system of a forced air cooling of power components and low-current components of an electrical device, comprising:
    a single enclosure comprising:
        a first independent cooling circuit,
        a second independent cooling circuit placed adjacent to the first independent cooling circuit,
        the first independent circuit being positioned in a sealed compartment, the sealed compartment being protected from contact with any outside element,
    the first independent cooling circuits comprising a first air channel and at least one heat exchanger,
    the second independent cooling circuit comprising a second air channel, the power electronic components, and at least two coolers arranged within the second air channel in a direction of airflow,
    wherein the at least two coolers are in thermal contact with the low-current electronic components, the low-current electronic components being located in the first independent cooling circuit,
    wherein the two independent cooling circuits are configured to be cooled with a single flow of previously cleaned extraneous air directed from a top of the single enclosure to a bottom part of the single enclosure,
    wherein the second air channel and the at least two coolers form a mixing zone of heated air and cool air,
    wherein a bypass air channel, supplying cool air into the mixing zone, is placed above at least one of the at least two coolers, wherein the power electronic components comprise at least one inductance coil with a closed core, said inductance coil comprising a solenoid which is cooled by the airflow, said airflow being concentrated in the air channels, said air channels being formed between polymer casings and coils of the solenoid.

2. The system of claim 1, wherein the bypass air channel is arranged within the second air channel and is configured to control the airflow by a partial closing of an inlet opening with a regulating gate.

3. The system of claim 1, wherein the mixing zone is arranged within a space located between the at least two coolers, said space further comprising a part of each cooler's internal volume.

4. The system of claim 1, further comprising:
at least one thermoelectric device for moisture removal from the single enclosure,
wherein the at least one thermoelectric device comprises cooled and heated surfaces, wherein the heated surface is in thermal contact with one of the at least two coolers.

5. A method for forced air cooling of power electronic components and low-current electronic components of an electronic device, comprising:
providing a single enclosure comprising:
a first independent cooling circuit,
a second independent cooling circuit placed adjacent to the first independent cooling circuit,
positioning the first independent circuit in a sealed compartment, the sealed compartment being protected from contact with any outside element,
wherein the first independent cooling circuit comprises a first air channel and at least one heat exchanger,
wherein the second independent cooling circuit comprises a second air channel, the power electronic components, and at least two coolers arranged within the second air channel in a direction of airflow,
positioning the coolers in thermal contact with the low-current electronic components, the low-current electronic components being located in the first independent cooling circuit, the power electronic components comprising at least one inductance coil with a closed core, said inductance coil comprising a solenoid which is cooled by the airflow, the airflow being concentrated in the air channels, the air channels being formed between polymer casings and coils of the solenoid,
configuring the two independent cooling circuits to be cooled with a single flow of previously cleaned extraneous air directed from a top part of the single enclosure to a bottom part of the single enclosure,
forming a mixing zone of heated and cool air between the at least two coolers within the second air channel, and
providing a bypass air channel, the bypass channel supplying cool air into the mixing zone, the bypass channel being placed above at least one of the at least two coolers.

6. The method of claim 5, further comprising providing at least one thermoelectric device, the thermoelectric device removing moisture from the single enclosure.

7. The method of claim 6, wherein the at least one thermoelectric device comprises heated and cooled surfaces, wherein the heated surface is placed in thermal contact with the one of the at least two coolers.

* * * * *